United States Patent
Machida

(10) Patent No.: US 10,859,321 B2
(45) Date of Patent: Dec. 8, 2020

(54) HEAT PIPE

(71) Applicant: Shinko Electric Industries Co., LTD., Nagano-Ken (JP)

(72) Inventor: Yoshihiro Machida, Nagano (JP)

(73) Assignee: Shinko Electric Industries Co., LTD., Nagano-ken (JP)

( * ) Notice: Subject to any disclaimer, the term of this patent is extended or adjusted under 35 U.S.C. 154(b) by 86 days.

(21) Appl. No.: 16/143,659

(22) Filed: Sep. 27, 2018

(65) Prior Publication Data
US 2019/0128618 A1   May 2, 2019

(30) Foreign Application Priority Data
Oct. 26, 2017 (JP) ................ 2017-207518

(51) Int. Cl.
| | |
|---|---|
| F28D 15/02 | (2006.01) |
| H01L 23/427 | (2006.01) |
| G06F 1/20 | (2006.01) |
| B23P 15/26 | (2006.01) |
| F28F 3/08 | (2006.01) |
| H05K 7/20 | (2006.01) |

(52) U.S. Cl.
CPC ......... *F28D 15/0283* (2013.01); *B23P 15/26* (2013.01); *F28D 15/0233* (2013.01); *F28F 3/08* (2013.01); *G06F 1/203* (2013.01); *H01L 23/427* (2013.01); *H05K 7/20336* (2013.01); *B23P 2700/09* (2013.01); *F28D 15/0266* (2013.01); *F28F 2230/00* (2013.01); *G06F 2200/201* (2013.01)

(58) Field of Classification Search
CPC ............ F28D 15/0283; F28D 15/0258; F28D 15/0233; F28D 15/043; F24C 2220/10; F24C 2280/02; A61M 1/0066
USPC ..................................... 165/104.26
See application file for complete search history.

(56) References Cited

U.S. PATENT DOCUMENTS

| | | | | |
|---|---|---|---|---|
| 3,397,648 A | * | 8/1968 | Henderson | A61M 1/0066 417/207 |
| 4,558,709 A | * | 12/1985 | Aida | A61B 5/097 600/532 |
| 5,743,014 A | * | 4/1998 | Giammaruti | F28D 15/0283 29/890.032 |
| 7,051,794 B2 | * | 5/2006 | Luo | F28D 15/0233 165/104.26 |
| 7,866,178 B2 | * | 1/2011 | Kung | F28D 15/0283 62/268 |
| 2009/0178784 A1 | * | 7/2009 | Wang | B23P 15/26 165/104.26 |
| 2010/0008043 A1 | * | 1/2010 | Yajima | F28D 15/0233 361/700 |

(Continued)

FOREIGN PATENT DOCUMENTS

JP        6146484 B2    6/2017

*Primary Examiner* — Jianying C Atkisson
*Assistant Examiner* — For K Ling
(74) *Attorney, Agent, or Firm* — Wolf, Greenfield & Sacks, P.C.

(57) ABSTRACT

A heat pipe includes an inlet through which a working fluid is injected. The inlet includes a non-sealed portion and a sealed portion connected to the non-sealed portion. The non-sealed portion and the sealed portion each include two outermost metal layers and a plurality of intermediate metal layers stacked between the outermost metal layers. The heat pipe further includes a porous body arranged in the inlet.

11 Claims, 6 Drawing Sheets

(56) References Cited

U.S. PATENT DOCUMENTS

2016/0259383 A1* 9/2016 Shioga .................... G06F 1/203

* cited by examiner

HEAT PIPE

CROSS-REFERENCE TO RELATED APPLICATIONS

This application is based upon and claims the benefit of priority from prior Japanese Patent Application No. 2017-207518, filed on Oct. 26, 2017, the entire contents of which are incorporated herein by reference.

FIELD

This disclosure relates to a heat pipe and a method for manufacturing the heat pipe.

BACKGROUND

A heat pipe that uses the phase transition of a working fluid is a device that cools a heat-generating component such as a semiconductor device (e.g., central processing unit (CPU)) installed in an electronic device. The heat pipe includes an inlet port through which the working fluid is injected into the heat pipe. After the heat pipe is filled with the working fluid, the end of the inlet port is sealed (refer to Japanese Patent No. 6146484).

SUMMARY

Electronic devices such as a mobile device have become thin. It is thus required that the heat pipe also be reduced in thickness. When the heat pipe is reduced in thickness, the inlet port is reduced in size. This hinders the injection of the working fluid. It is thus required that the working fluid injection efficiency be improved.

A heat pipe in accordance with one embodiment includes an inlet through which a working fluid is injected. The inlet includes a non-sealed portion and a sealed portion connected to the non-sealed portion. The non-sealed portion and the sealed portion each include two outermost metal layers and a plurality of intermediate metal layers stacked between the outermost metal layers. The heat pipe further includes a porous body arranged in the inlet.

A heat pipe in accordance with a further embodiment includes a hermetically sealed inlet through which a working fluid is injected. The inlet includes a non-sealed portion and a sealed portion connected to the non-sealed portion. The non-sealed portion and the sealed portion each include two outermost metal layers and a plurality of intermediate metal layers stacked between the outermost metal layers. The heat pipe further includes a porous body sandwiched between the two outermost metal layers.

A method for manufacturing a heat pipe in accordance with another embodiment includes stacking a plurality of metal layers to form an inlet through which a working fluid is injected. The metal layers include two outermost metal layers and a plurality of intermediate metal layers stacked between the outermost metal layers. The method further includes arranging a porous body in the inlet, and forming a sealed portion by injecting the working fluid through the porous body into the heat pipe and then pressing and flattening the outermost metal layers and the intermediate metal layers in a stacking direction so as to hermetically seal the inlet.

Other embodiments and advantages thereof will become apparent from the following description, taken in conjunction with the accompanying drawings, illustrating by way of example the principles of the invention. It is to be understood that both the foregoing general description and the following detailed description are exemplary and explanatory and are not restrictive of the invention, as claimed.

BRIEF DESCRIPTION OF THE DRAWINGS

The embodiments, together with objects and advantages thereof, may best be understood by reference to the following description of the presently preferred embodiments together with the accompanying drawings in which.

DESCRIPTION OF THE EMBODIMENTS

Figure 1:
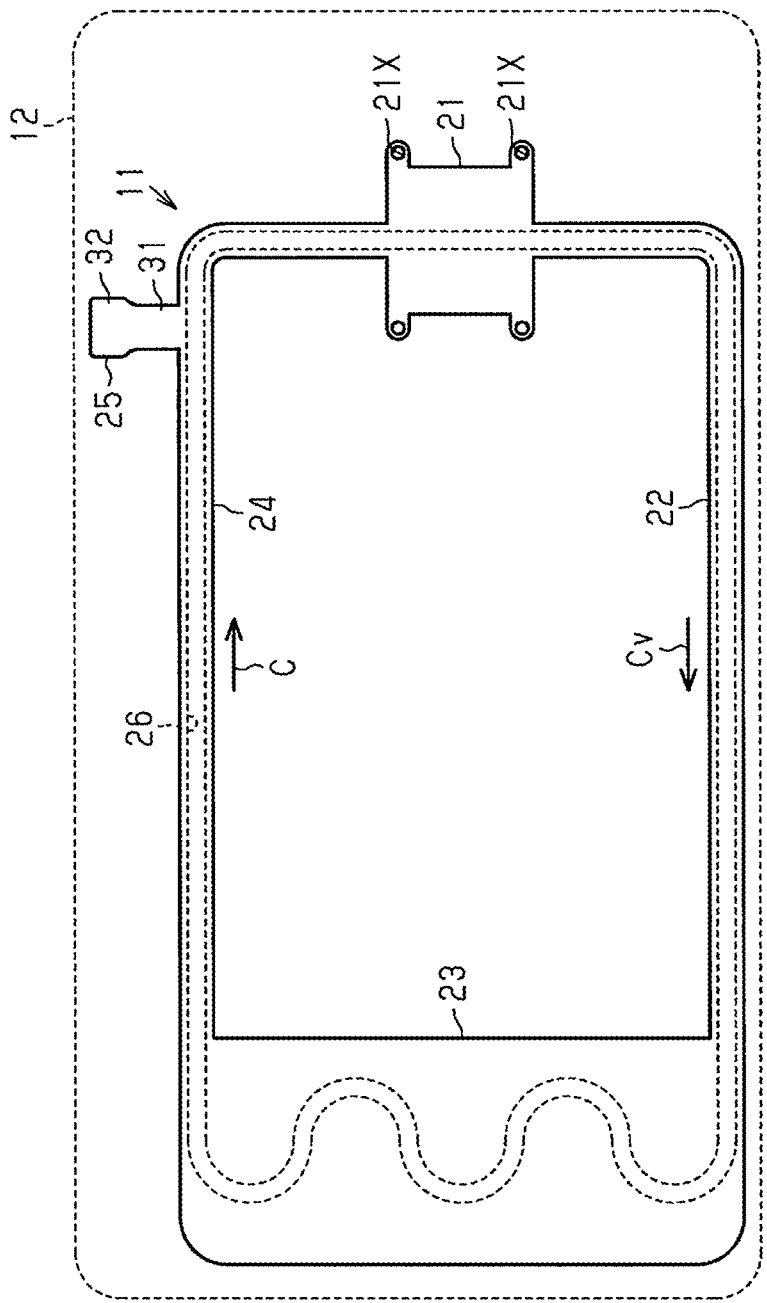
FIG. 1 is a schematic plan view of one embodiment of a loop heat pipe.

Embodiments will now be described with reference to the drawings. In the drawings, elements are illustrated for simplicity and clarity and have not necessarily been drawn to scale. To facilitate understanding, hatching lines may not be illustrated or be replaced by shadings in the cross-sectional drawings.

Referring to FIG. 1, a loop heat pipe 11 is accommodated in, for example, a mobile electronic device 12 such as a smartphone or a tablet.

The loop heat pipe 11 (simply referred to as the heat pipe 11) includes an evaporator 21, an evaporation pipe 22, a condenser 23, a liquid pipe 24, and an inlet 25. The evaporator 21 is connected by the evaporation pipe 22 to the condenser 23, and the condenser 23 is connected by the liquid pipe 24 to the evaporator 21.

The evaporator 21 functions to vaporize a working fluid C and generate vapor Cv. The vapor Cv of the working fluid C flows through the evaporation pipe 22 to the condenser 23. The condenser 23 functions to liquefy the vapor of the working fluid C. The liquefied working fluid C flows through the liquid pipe 24 to the evaporator 21. The evaporator 21, the evaporation pipe 22, the condenser 23, and the liquid pipe 24 form a flow passage 26 configuring a loop through which the liquefied working fluid C or the vapor Cv flows.

The evaporator 21 is fixed to a heat-generating component in contact with the heat-generating component. In the present embodiment, the evaporator 21 includes, for example, four through holes 21X. Bolts are inserted through the through holes 21X to fix the evaporator 21 to a circuit board or the like on which the heat-generating component is mounted.

The evaporator 21 uses the heat generated by the heat-generating component to vaporize the working fluid C into the vapor Cv. The vapor Cv generated in the evaporator 21 is guided through the evaporation pipe 22 to the condenser 23 and liquefied in the condenser 23. This transfers the heat of the heat generation component to the condenser 23 and limits increases in the temperature of the heat-generating component. From the condenser 23, the liquefied working fluid C is guided through the liquid pipe 24 to the evaporator 21.

Preferably, a fluid having a high vapor pressure and a large latent heat of vaporization is used as the working fluid C. The use of such a working fluid C efficiently cools the heat-generating component with the latent heat of vaporization. The working fluid C may be, for example, ammonia, water, fluorocarbon, alcohol, or acetone.

The inlet 25 serves as an entrance for the working fluid C when filling the heat pipe 11 with the working fluid C. In the present embodiment, the inlet 25 is connected to the liquid pipe 24. The inlet 25 is hermetically sealed after injecting the working fluid C. The inlet 25 may also be connected to the condenser 23, the evaporation pipe 22, or the evaporator 21. In this case, the injected working fluid C moves from the injected location into the liquid pipe 24.

In the present embodiment, the inlet 25 includes a non-sealed portion 31 that is connected to the liquid pipe 24 and a sealed portion 32 that is connected to the non-sealed portion 31. The shape of the non-sealed portion 31 is substantially maintained before and after the inlet 25 is sealed. That is, the shape of the non-sealed portion 31 after the inlet 25 is sealed is substantially the same as the shape of the non-sealed portion 31 when injecting the working fluid C into the liquid pipe 24. The sealed portion 32 has the same shape as the non-sealed portion 31 when injecting the working liquid C into the liquid pipe 24. After the liquid pipe 24 is filled with the working fluid C, the sealed portion 32 is squeezed and flattened to hermetically seal the inlet 25 so that the working fluid C does not leak out of the liquid pipe 24.

The heat pipe 11 may be constructed by, for example, stacking a plurality of metal layers. The metal layers are, for example, copper layers having superior thermal conductivity and directly bonded to one another through solid-state welding. The metal layers each have a thickness of, for example, approximately 50 μm to 200 μm. The metal layers are not limited to copper layers and may be stainless layers, aluminum layers, or magnesium layers. Further, there is particularly no limit to the number of metal layers. The material of one or more of the stacked metal layers may differ from the material of the other metal layers.

Figure 2A:
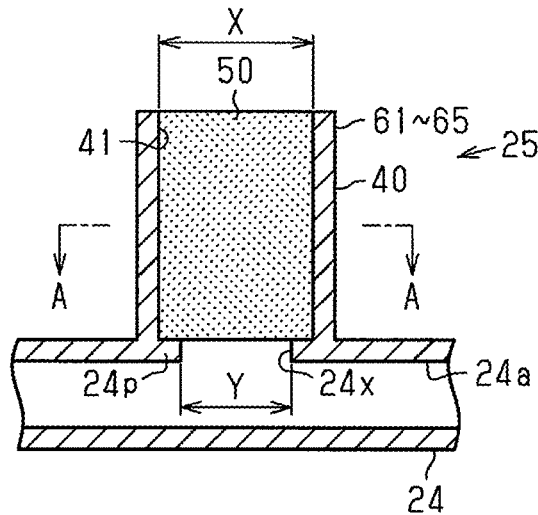
FIG. 2A is a schematic plan view of an inlet of the heat pipe illustrated in FIG. 1.
Figure 2B:
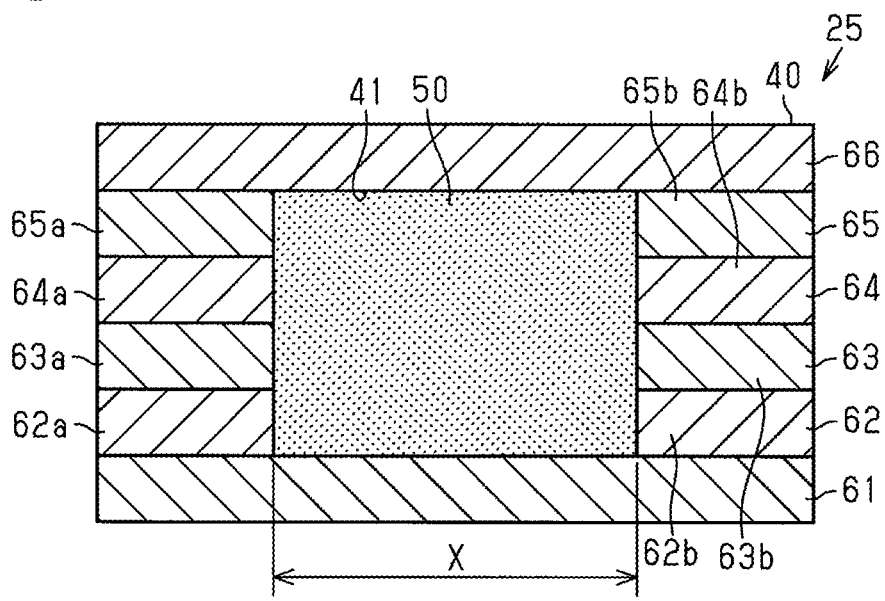
FIG. 2B is a cross-sectional view taken along line A-A in FIG. 2A.

FIGS. 2A and 2B illustrate a state prior to sealing off of the inlet 25. FIG. 2A is a plan view illustrating one example of the inlet 25, and FIG. 2B is a cross-sectional view taken along line A-A in FIG. 2A. In the present embodiment, referring to FIG. 2B, the heat pipe 11 may be formed by metal layers 61 to 66. Among the metal layers 61 to 66, the uppermost metal layer 66 is removed in FIG. 2A.

As illustrated in FIGS. 2A and 2B, the inlet 25 includes an inlet port 40 and a porous body 50 arranged in the inlet port 40.

As illustrated in FIG. 2B, the inlet port 40 may be constructed by, for example, sequentially stacking the outermost metal layer 61, the intermediate metal layers 62 to 65, and the outermost metal layer 66. In the description hereafter, the outermost metal layers will not be distinguished from the intermediate metal layers when there is no need to do so. The inlet port 40 may be formed integrally with the liquid pipe 24 and the like. In FIG. 2B, to aid understanding, the metal layers 61 to 66 are indicated in solid lines and hatched differently. However, for example, when the metal layers 61 to 66 are integrated through diffusion bonding, the interfaces of the metal layers 61 to 66 may be eliminated. Thus, boundaries will not be clear. The same applies to the interfaces and boundaries in the structure subsequent to sealing and in the structures of modified examples described below.

The outermost metal layers 61 and 66 are located at the outermost sides of the stacked metal layers constructing the inlet port 40 and respectively correspond to the lowermost metal layer and the uppermost metal layer. The intermediate metal layers 62 to 65 are located between the outermost metal layer 61 and the outermost metal layer 66. The outermost metal layers 61 and 66 are each solid and do not include holes or grooves. The outermost metal layers 61 and 66 form parts of the outer walls of the inlet port 40.

The intermediate metal layer 62 includes substantially parallel wall portions 62a and 62b spaced apart by a given distance in a widthwise direction (left-right direction in FIG. 2B). In the same manner as the intermediate metal layer 62, the intermediate layers 63, 64, and 65 respectively include substantially parallel wall portions 63a, 63b, 64a, 64b, 65a, and 65b spaced apart by the given distance. The wall portions 62a to 65a and 62b to 65b of the intermediate metal layers 62 to 65 form parts of the outer walls of the inlet port 40.

As illustrated in FIG. 2A, the liquid pipe 24, which defines the flow passage 26 (refer to FIG. 1), has a wall 24a including an opening 24x in the vicinity of the inlet port 40. As illustrated in FIGS. 2A and 2B, in the present embodiment, the inlet port 40 includes an inlet passage 41 formed by the metal layers 61 to 66. The inlet passage 41 has a width X that is the distance from the wall portions 62a to 65a to the wall portions 62b to 65b in the intermediate metal layers 62 to 65. The width X of the inlet passage 41 is larger than a width Y of the opening 24x. The wall 24a of the liquid pipe 24 includes ends 24p determining the width Y of the opening 24x. Each end 24p projects into the inlet passage 41 from the wall portions 62a to 65a and 62b to 65b of the intermediate metal layers 62 to 65 in the inlet port 40. The ends 24p of the wall 24a of the liquid pipe 24 avoid unnecessary entrance of the porous body 50 into the flow passage of the liquid pipe 24. The ends 24p may be referred to as the protrusions.

The inlet passage 41 is formed by the outermost metal layers 61 and 66 and the wall portions 62a to 65a and 62b to 65b of the intermediate metal layers 62 to 65. The working fluid C is injected through the inlet passage 41 into the liquid pipe 24.

As illustrated in FIGS. 2A and 2B, the porous body 50 is arranged in the inlet port 40. In the present embodiment, interior of the inlet port 40, namely, the inlet passage 41 is filled with the porous body 50. The porous body 50 is a structure including pores. For example, a metal fiber sheet (non-woven cloth of metal fibers) may be used as the porous body 50. The metal used in the porous body 50 may be, for example, copper, copper alloy, stainless steel, aluminum, magnesium alloy, or the like.

Figure 3:
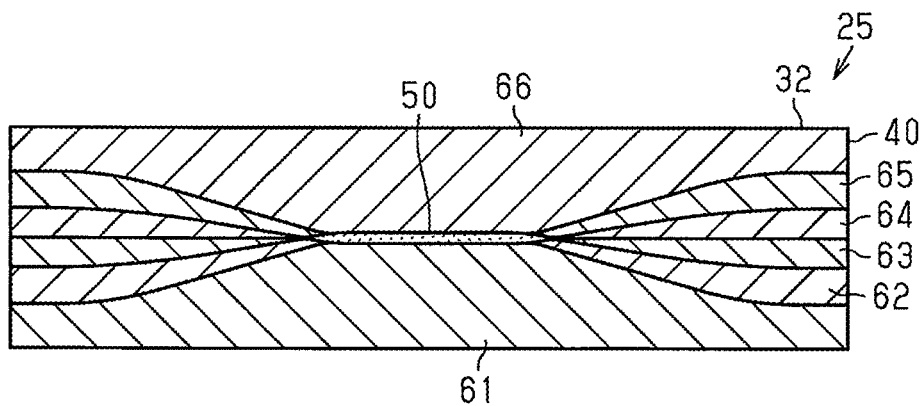
FIG. 3 is a schematic cross-sectional view of the inlet when sealed.

Referring to FIG. 3, after injecting the working fluid C into the liquid pipe 24, the sealed portion 32 is formed by squeezing and flattening the outermost metal layers 61 and 66, the intermediate metal layers 62 to 65, and the porous body 50, which are illustrated in FIGS. 2A and 2B, in the vertical direction of FIG. 3 (i.e., stacking direction). The sealed portion 32 may be formed through, for example, ultrasonic welding. Ultrasonic welding applies ultrasonic waves to welded subjects to pressurize and bond the welded subjects. To accelerate the welding, the welded subjects may be heated. In the sealed portion 32, the squeezed porous body 50 is sandwiched between the outermost metal layers 61 and 66. Even when gaps are formed within the porous body 50 or between the porous body 50 and the metal layers 61 to 66, hermetic sealing is established as long as the gaps do not connect the flow passage 26 and the outside of the heat pipe 11.

The present embodiment has the advantage described below.

The heat pipe 11 includes the inlet 25 through which the working fluid C is injected. The inlet 25 includes the inlet port 40, through which the working fluid C is injected into the heat pipe 11, and the porous body 50, which is arranged in the inlet port 40. The porous body 50 includes pores. The pores produce capillary force acting on the working fluid C. The working fluid C is smoothly guided by the porous body 50 from the outside of the heat pipe 11 to the inside of the inlet port 40. The working fluid C is moved by the porous body 50 in the inlet port 40 and drawn from the opening 24x of the liquid pipe 24 into the liquid pipe 24. In this manner, the arrangement of the porous body 50 in the inlet port 40 smoothly injects the working fluid C into the heat pipe 11.

It should be apparent to those skilled in the art that the foregoing embodiments may be implemented in many other specific forms without departing from the scope of this disclosure. Particularly, it should be understood that the foregoing embodiments may be implemented in the following forms.

The construction of the inlet 25 (inlet port 40 and porous body 50) may be changed.

Figure 4A:
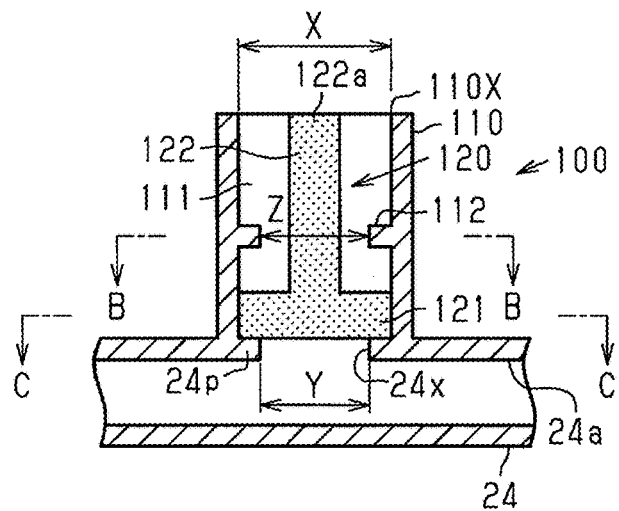
FIG. 4A is a schematic plan view illustrating a modified example of the inlet.
Figure 4B:
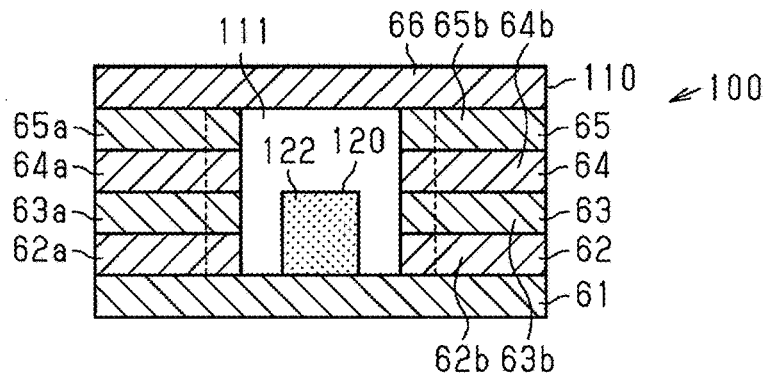
FIG. 4B is a cross-sectional view taken along line B-B in FIG. 4A.
Figure 4C:
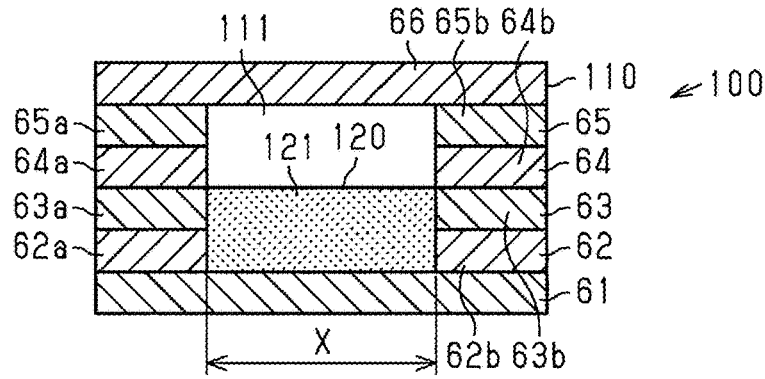
FIG. 4C is a cross-sectional view taken along line C-C in FIG. 4A.

Referring to FIGS. 4A to 4C, an inlet 100 includes an inlet port 110 and a porous body 120. The porous body 120 includes a support portion 121 and a drawing portion 122. As illustrated in FIGS. 4A and 4C, the inlet port 110 includes an inlet passage 111 having the width X. The support portion 121 extends in the widthwise direction of the inlet 100 and has the same width as the width X of the inlet passage 111.

The drawing portion 122 extends from the support portion 121 toward an opening 110X of the inlet port 110. The support portion 121 and the drawing portion 122 are arranged so that the porous body 120 is T-shaped in a plan view as illustrated in FIG. 4A. The drawing portion 122 has a width that is set to be smaller than the width X of the inlet passage 111 (width of opening 110X).

Referring to FIG. 4B, the drawing portion 122 has a thickness (height) that is smaller than the height of the inlet passage 111. Referring to FIG. 4C, the support portion 121 has a thickness (height) that is smaller than the height of the inlet passage 111. Thus, the weight of the support portion 121 and the drawing portion 122 spaces the support portion 121 and the drawing portion 122 apart from the outermost metal layer 66 (uppermost metal layer as viewed in FIG. 4C), which forms the outer wall of the inlet port 110. The drawing portion 122 is spaced apart from the wall portions 62a to 65a and 62b to 65b of the intermediate metal layers 62 to 65. The support portion 121 is spaced apart from the wall portions 64a, 65a, 64b, and 65b of the intermediate metal layers 64 and 65. The porous body 120 (support 121 and drawing portion 122) is movable along the inlet passage 111.

The inlet port 110 includes projections 112 located closer to the opening 110X than the support portion 121. The projections 112 project from opposite wall portions of the inlet port 110 toward the drawing portion 122. In the widthwise direction of the inlet 100 (left-right direction in FIG. 4A), a width Z between the two projections 112 is smaller than the width X of the inlet passage 111. When the porous body 120 moves along the inlet passage 111 toward the opening 110X of the inlet port 110, the support portion 121 of the porous body 120 comes into contact with the projections 112. This restricts further movement of the porous body 120. Accordingly, the projections 112 restrict separation of the porous body 120 from the inlet port 110.

Figure 4D:
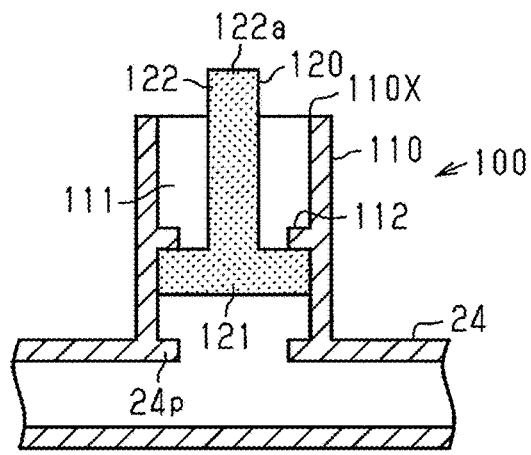
FIG. 4D is a schematic plan view illustrating how the inlet of FIG. 4A operates.

Referring to FIG. 4D, the projections 112 are formed at locations where a distal end of the porous body 120, that is, a distal end 122a of the drawing portion 122, projects out of the opening 110X of the inlet port 110 when the support portion 121 comes into contact with the projection 112. In this manner, the projection of the distal end 122a of the drawing portion 122 out of the opening 110X of the inlet port 110 facilitates the injection of the working fluid C. This will be described with reference to FIGS. 5A to 5C.

Figure 5A:
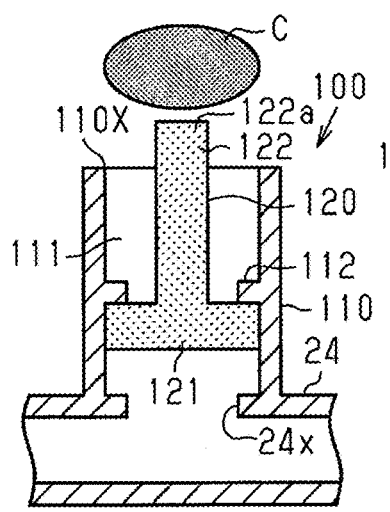
FIGS. 5A to 5C are schematic plan views illustrating injection of the working fluid into the inlet of FIG. 4A.
Figure 5B:
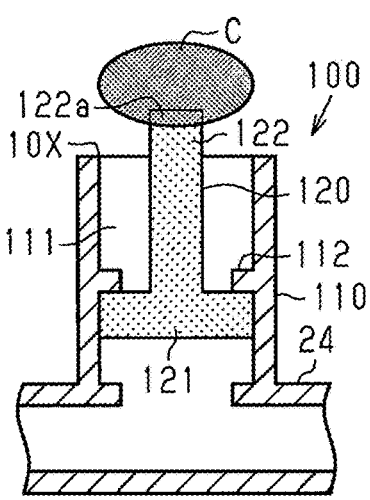
Figure 5C:
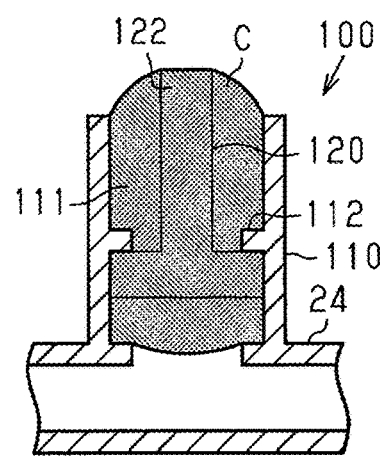

Referring to FIG. 5A, the working fluid C is injected in a state in which the distal end 122a of the drawing portion 122 is projected out of the opening 110X. Referring to FIG. 5B, the working fluid C easily collects on the distal end 122a of the drawing portion 122 projecting out of the opening 110X. The capillary force produced by the pores of the porous body 120 draws the working fluid C to the inlet passage 111 of the inlet port 110. Referring to FIG. 5C, this fills the inlet passage 111 with the working fluid C. Then, the working fluid C moves from the inlet passage 111 into the liquid pipe 24. In this manner, the injection of the working fluid C is facilitated.

The porous body 120 is movable along the inlet passage 111 of the inlet port 110. This allows the sealed portion to be set in accordance with the position of the porous body 120. That is, the sealed portion may be set at a position where the porous body 120 is present or at a position where the porous body 120 is not present. This will now be described in further detail with reference to FIGS. 6A to 6C.

Figure 6A:
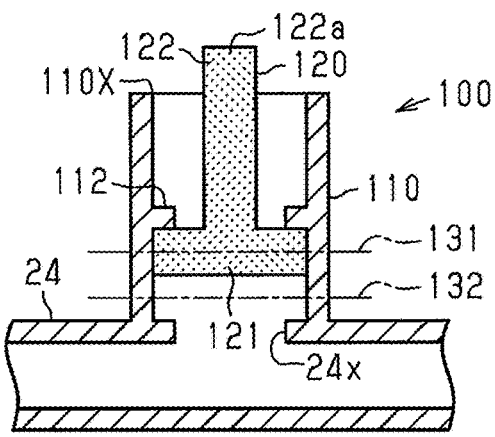
FIG. 6A is a schematic plan view illustrating first and second sealing positions in the inlet of FIG. 4A.
Figure 6B:
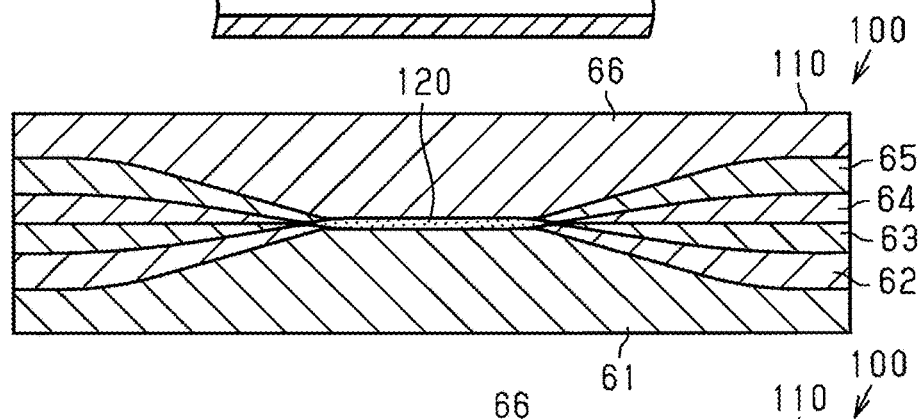
FIG. 6B is a schematic cross-sectional view taken at the first sealing first position in FIG. 6A.
Figure 6C:
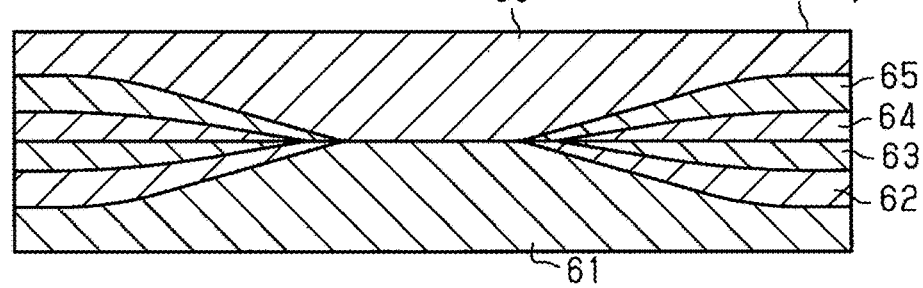
FIG. 6C is a schematic cross-sectional view taken at the second sealing position in FIG. 6A.

FIG. 6A indicates two potential sealing positions 131 and 132 with single-dashed lines. The porous body 120 is present at the sealing position 131. For example, when the sealing position 131 is set as the sealed portion, portions of the inlet 100 excluding the sealing position 131 (and vicinity of sealing position 131) may be set as the non-sealed portion. Subsequent to injection of the working fluid C, when the inlet 100 is sealed at the sealing position 131, as illustrated in FIG. 6B, the flattened sealed portion (sealing position 131) of the inlet 100 includes the porous body 120 sandwiched between the outermost metal layers 61 and 66. The porous body 120 is not present at the sealing position 132 illustrated in FIG. 6A. For example, when the sealing position 132 is set as the sealed portion, portions of the inlet 100 excluding the sealing position 132 (and its vicinity) may be set as the non-sealed portion. Subsequent to injection of the working fluid C, when the inlet 100 is sealed at the sealing position 132. As illustrated in FIG. 6C, at the flattened sealed portion (sealing position 132) of the inlet 100, the outermost metal layers 61 and 66 are directly bonded to each other. Further, the porous body 120 is not sandwiched between the outermost metal layers 61 and 66.

As described in the above embodiment, solid-state welding such as ultrasonic welding may be performed to hermetically seal the inlet 100. In solid-state welding, it is preferred that the welding subjects be formed from the same material. Thus, when the material of the inlet port 110 is the same as that of the porous body 120, the inlet 100 is hermetically sealed in a preferred manner at the sealing position 131 illustrated in FIG. 6A. Alternatively, the sealing positions 131 and 132 may both be set as the sealed portion. The location of the sealed portion is not limited to the sealing positions 131 and 132. For example, the location where the drawing portion 122 of the porous body 120 is squeezed may be set as the sealed portion. The material of the inlet port 110 does not have to be the same as the material of the porous body 120. When the material of the inlet port 110 differs from the material of the porous body 120, the inlet 100 is hermetically sealed at, for example, the sealing position 132 illustrated in FIG. 6A.

Figure 7A:
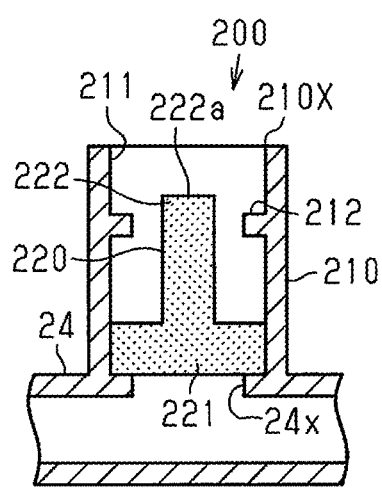
FIGS. 7A to 7C are schematic plan views illustrating a modified example of the inlet.
Figure 7B:
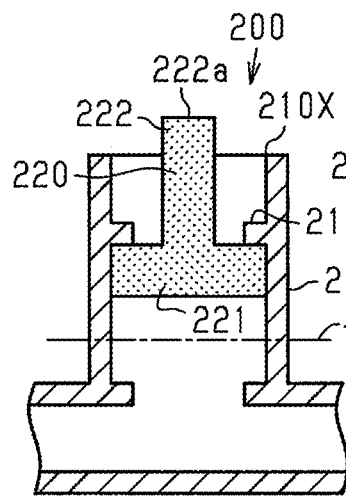
Figure 7C:
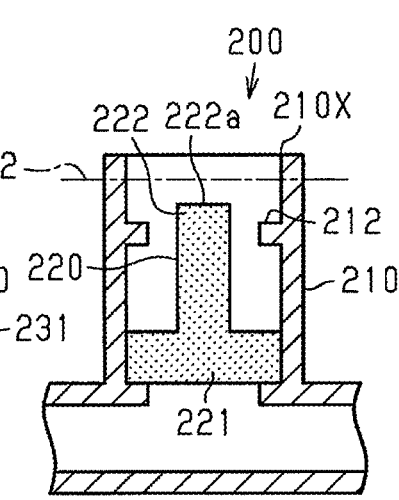

FIGS. 7A to 7C illustrate another modified example of an inlet 200. The inlet 200 includes an inlet port 210 and a porous body 220. The porous body 220 includes a support portion 221 and a drawing portion 222. The porous body 220 (support portion 221 and drawing portion 222) is movable along the inlet 200 (inlet passage 211) between a projected position of FIG. 7B and a retreated position of FIG. 7C. As illustrated in FIG. 7A, the porous body 220 may be shorter than the inlet port 210 (inlet passage 211). In this case, when the porous body 220 is at the retreated position of FIG. 7C, that is, when the support portion 221 is positioned in contact with the liquid pipe 24, a distal end portion 222a of the drawing portion 222 is retracted into the inlet port 210 and located inward from an opening 210X. The inlet port 210 includes projections 212 formed in the same manner as the projections 112 of FIG. 4A. As illustrated in FIG. 7B, when the porous body 220 is at the projected position, that is, when the support portion 221 of the porous body 220 comes into contact with the projections 212 of the inlet port 210, the distal end portion 222a of the drawing portion 222 projects out of the opening 210X of the inlet port 210. This allows for easy injection of the working fluid C as described above with reference to FIGS. 5A to 5C.

Referring to FIG. 7B, a sealing position 231 may be set at a sealed portion where the inlet 200 is sealed in a state in which the distal end portion 222a of the drawing portion 222 projects out of the opening 210X of the inlet port 210. In this case, portions of the inlet 200 excluding the sealing position 231 (and vicinity of sealing position 231) may be set as the non-sealed portion. Alternatively, referring to FIG. 7C, a sealing position 232 may be set at a sealed portion where the inlet 200 is sealed in a state in which the distal end portion 222a of the drawing portion 222 is retracted into the inlet port 210 and located inward from the opening 210X. In this case, portions of the inlet 200 excluding the sealing position 232 (and vicinity of sealing position 232) may be set as the non-sealed portion. The porous body 220 is not present at each of the sealing positions 231 and 232. Accordingly, as described with reference to FIG. 6C, the outermost metal layers 61 and 66, which are of the same material, are directly welded to each other. Thus, the material of the porous body 220 may differ from the material of the inlet port 210. That is, the porous body 220 may be formed from any material.

Figure 8A:
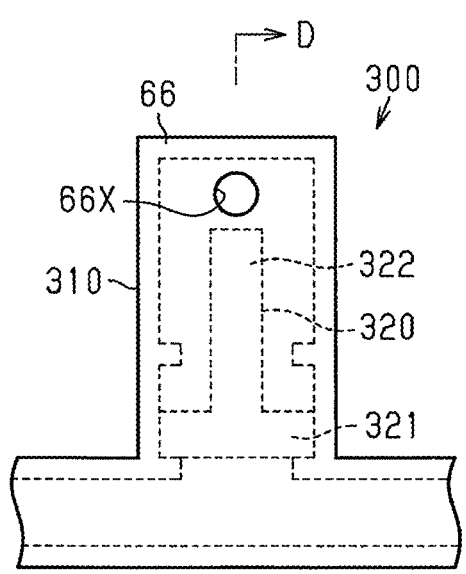
FIG. 8A is a schematic plan view illustrating another modified example of the inlet.
Figure 8B:
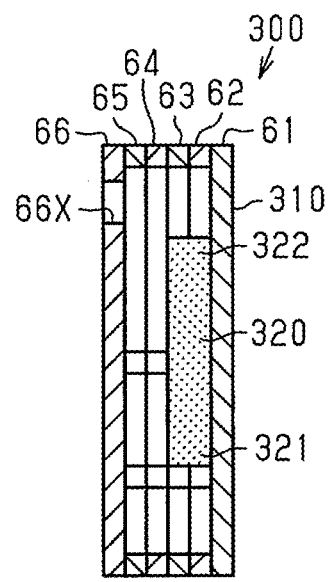
FIG. 8B is a cross-sectional view taken along line D-D in FIG. 8A.

FIGS. 8A and 8B illustrate a further modified example of an inlet 300. The inlet 300 includes an inlet port 310 and a porous body 320. FIG. 8B is a cross-sectional view taken along line D-D in FIG. 8A. The porous body 320 includes a support portion 321 and a drawing portion 322. The inlet port 310 includes an opening 66X in the outermost metal layer 66 of the inlet port 310. The working fluid C is injected from the opening 66X.

Figure 9A:
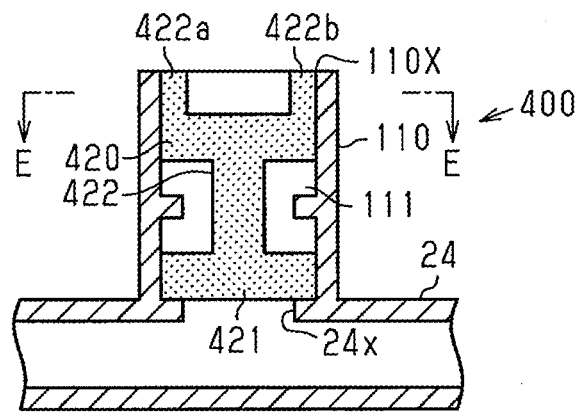
FIG. 9A is a schematic plan view illustrating a further modified example of the inlet.
Figure 9B:
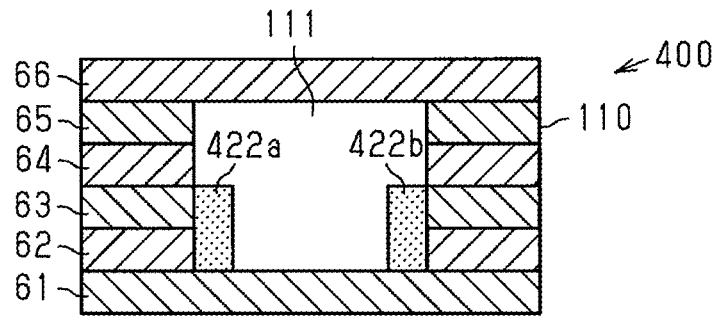
FIG. 9B is a cross-sectional view taken along line E-E in FIG. 9A.

FIGS. 9A and 9B illustrate a further modified example of an inlet 400. The inlet 400 includes the inlet port 110 and a porous body 420. FIG. 9B is a cross-sectional view taken along line E-E in FIG. 9A. The porous body 420 includes a support portion 421 and a drawing portion 422. The drawing portion 420 includes two distal end portions 422a and 422b. The distal end portions 422a and 422b are arranged on opposite wall portions of the inlet passage 111 in the inlet port 110. The porous body 420 is movable along the inlet passage 111. The distal end portions 422a and 422b are projectable out of the opening 110X of the inlet port 110. The projection of the distal end portions 422a and 422b out of the opening 110X allows the working fluid C to be further easily drawn into the porous body 420. This further facilities the injection of the working fluid C.

Figure 10A:
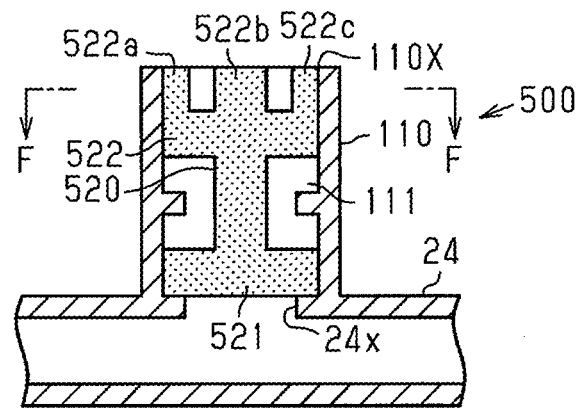
FIG. 10A is a schematic plan view illustrating a further modified example of the inlet.
Figure 10B:
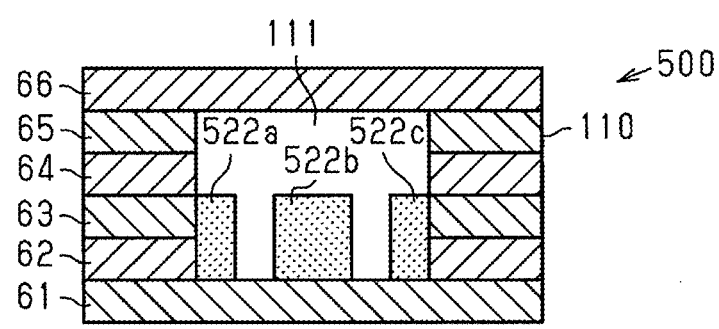
FIG. 10B is a cross-sectional view taken along line F-F in FIG. 10A.

FIGS. 10A and 10B illustrate a further modified example of an inlet 500. The inlet 500 includes the inlet port 110 and a porous body 520. FIG. 10B is a cross-sectional view taken along line F-F in FIG. 10A. The porous body 520 includes a support portion 521 and a drawing portion 522. The drawing portion 522 includes three distal end portions 522a, 522b, and 522c. The distal end portions 522a and 522c are arranged on opposite wall portions of the inlet passage 111 in the inlet port 110. The porous body 520 is movable along the inlet passage 111. The distal end portions 522a to 522c are projectable out of the opening 110X of the inlet port 110. The projection of the distal end portions 522a to 522c out of the opening 110X allows the working fluid C to be further easily drawn into the porous body 520. This further facilitates the injection of the working fluid C.

The inlets 25, 100, 200, 300, 400, and 500 in each of the above embodiments may be applied to a heat pipe other than a loop heat pipe. For example, the inlets 25, 100, 200, 300, 400, and 500 may be applied to a flat heat pipe.

CLAUSES

This disclosure further encompasses the following embodiments.

1. A method for manufacturing a heat pipe, the method including:

stacking a plurality of metal layers to form an inlet through which a working fluid is injected, wherein the metal layers include two outermost metal layers and a plurality of intermediate metal layers stacked between the outermost metal layers;

arranging a porous body in the inlet; and forming a sealed portion in the inlet to hermetically seal the inlet, wherein the sealed portion is formed by injecting the working fluid through the porous body into the heat pipe and then pressing and flattening the outermost metal layers and the intermediate metal layers in a stacking direction.

2. The method according to clause 1, wherein the forming a sealed portion includes pressing and flattening the outermost metal layers, the intermediate metal layers, and the porous body in the stacking direction at a location where the porous body is sandwiched between the two outermost metal layers.

3. The method according to clause 1, wherein the forming a sealed portion includes pressing and flattening the outermost metal layers and the intermediate metal layers in the stacking direction at a location where the porous body is not sandwiched between the two outermost metal layers.

All examples and conditional language recited herein are intended for pedagogical purposes to aid the reader in understanding the principles of the invention and the concepts contributed by the inventor to furthering the art, and are to be construed as being without limitation to such specifically recited examples and conditions, nor does the organization of such examples in the specification relate to an illustration of the superiority and inferiority of the invention. Although embodiments have been described in detail, it should be understood that various changes, substitutions, and alterations could be made hereto without departing from the scope of this disclosure.

The invention claimed is:

1. A heat pipe comprising:
a flow passage;
an inlet through which a working fluid is injected; and
a porous body arranged in the inlet, wherein
    the inlet includes a non-sealed portion and a sealed portion,
    the non-sealed portion connects the sealed portion and the flow passage along a first direction, and
    the non-sealed portion and the sealed portion include a plurality of metal layers stacked along a second direction orthogonal to the first direction.

2. The heat pipe according to claim 1, wherein the porous body is spaced apart from one of two outermost metal layers of the plurality of metal layers.

3. The heat pipe according to claim 1, wherein the porous body is movable along the inlet and includes a distal end portion that is projectable out of an opening of the inlet.

4. The heat pipe according to claim 3, wherein
the porous body is movable along the inlet between a projected position and a retreated position,
the distal end portion is projected out of the opening of the inlet when the porous body is at the projected position, and
the distal end portion is retreated into the inlet and located inward from the opening when the porous body is at the retreated position.

5. The heat pipe according to claim 1, wherein:
the porous body includes
    a support portion extending in a widthwise direction of the inlet, and
    a drawing portion extending from the support portion toward an opening of the inlet;
the plurality of metal layers include two outermost metal layers and a plurality of intermediate metal layers stacked between the two outermost metal layers in the second direction; and
at least part of the drawing portion is spaced apart from wall portions formed by the plurality of intermediate metal layers.

6. The heat pipe according to claim 5, wherein each of the wall portions of the plurality of intermediate metal layers includes a projection that projects toward the drawing portion of the porous body.

7. The heat pipe according to claim 1, wherein the inlet is filled with the porous body.

8. The heat pipe according to claim 1, wherein
the inlet is connected to a wall of a flow passage through which the working fluid flows,
the inlet includes an inlet passage having a first width,
the wall of the flow passage includes an opening that is in communication with the inlet passage, wherein the opening of the wall of the flow passage has a second width that is smaller than the first width, and
at least part of the porous body includes the first width.

9. A heat pipe comprising:
a flow passage; and
a hermetically sealed inlet through which a working fluid is injected, wherein
    the inlet includes a non-sealed portion and a sealed portion connected to the non-sealed portion along a first direction,
    the non-sealed portion and the sealed portion include a plurality of metal layers stacked along a second direction orthogonal to the first direction, and
    the sealed portion includes a porous body sandwiched between two outermost metal layers of the plurality of metal layers.

10. The heat pipe according to claim 1, wherein
the heat pipe is formed by a metal stack of the plurality of metal layers, the metal stack including:
    the inlet;
    an evaporator;
    an evaporation pipe connected to the evaporator;
    a condenser connected to the evaporation pipe; and
    a liquid pipe connected to the condenser and the evaporator,
    wherein the flow passage is a loop flow passage formed by the evaporator, the evaporation pipe, the condenser, and the liquid pipe, and
    the loop flow passage includes a wall having an opening that is in communication with the inlet, the wall of the loop flow passage defines a width of the opening to avoid entrance of the porous body into the loop flow passage from the inlet.

11. The heat pipe according to claim 9, wherein
the heat pipe is formed by a metal stack of the plurality of metal layers, the metal stack including:
    the inlet;
    an evaporator;
    an evaporation pipe connected to the evaporator;
    a condenser connected to the evaporation pipe; and
    a liquid pipe connected to the condenser and the evaporator,
    wherein the flow passage is a loop flow passage formed by the evaporator, the evaporation pipe, the condenser, and the liquid pipe, and
    the loop flow passage includes a wall having an opening that is in communication with the inlet, the wall of the loop flow passage defines a width of the opening to avoid entrance of the porous body into the loop flow passage from the inlet.

* * * * *